United States Patent [19]

Radichel et al.

[11] 4,001,818
[45] Jan. 4, 1977

[54] DIGITAL CIRCUIT FAILURE DETECTOR

[75] Inventors: Frank Radichel, Thornton; Richard Wirkkanen, Broomfield, both of Colo.

[73] Assignee: Storage Technology Corporation, Louisville, Colo.

[22] Filed: Oct. 22, 1975

[21] Appl. No.: 624,610

[52] U.S. Cl. .................. 340/415; 235/153 AK; 324/52; 324/73 AT
[51] Int. Cl.² .................................. G08B 21/00
[58] Field of Search ........... 340/213 R, 253 B, 255, 340/411, 413, 414, 415; 235/151.3, 153 AC, 153 AK; 324/51, 52, 72.5, 73 R, 73 AT, 73 PC

[56] References Cited
UNITED STATES PATENTS

| | | | |
|---|---|---|---|
| 2,925,591 | 2/1960 | Burkhart | 340/213 |
| 2,988,694 | 6/1961 | Hessinger et al. | 324/73 R |
| 3,777,129 | 12/1973 | Mehia | 235/151.3 |
| 3,826,909 | 7/1974 | Ivashin | 235/153 AC |
| 3,833,853 | 9/1974 | Milford | 324/73 R |
| 3,870,953 | 3/1975 | Boatman et al. | 324/73 R |
| 3,882,386 | 5/1975 | Vinsani | 324/73 R |

OTHER PUBLICATIONS

IBM Tech. Disclosure; Carey, et al., Comparative Circuit Tester, vol. 16, No. 10, p. 3151; 3/1974.
IBM Tech. Disclosure; Wood; First Alarm Indicator, vol. 3, No. 7, p. 18, 12/1960.

Primary Examiner—Alvin H. Waring
Attorney, Agent, or Firm—Woodcock Washburn Kurtz & Mackiewicz

[57] ABSTRACT

A device for detecting the existence and location of failures on circuit boards is disclosed. The device is specially adapted for use with boards having a number of serially connected digital loops. Digital circuitry is provided which simultaneously compares a number of checkpoints on the faulty board with corresponding points on a known good board, and the first point to fail is isolated. Inhibit circuitry prevents failure indications at checkpoints if those failures occur subsequent to the first failure.

6 Claims, 3 Drawing Figures

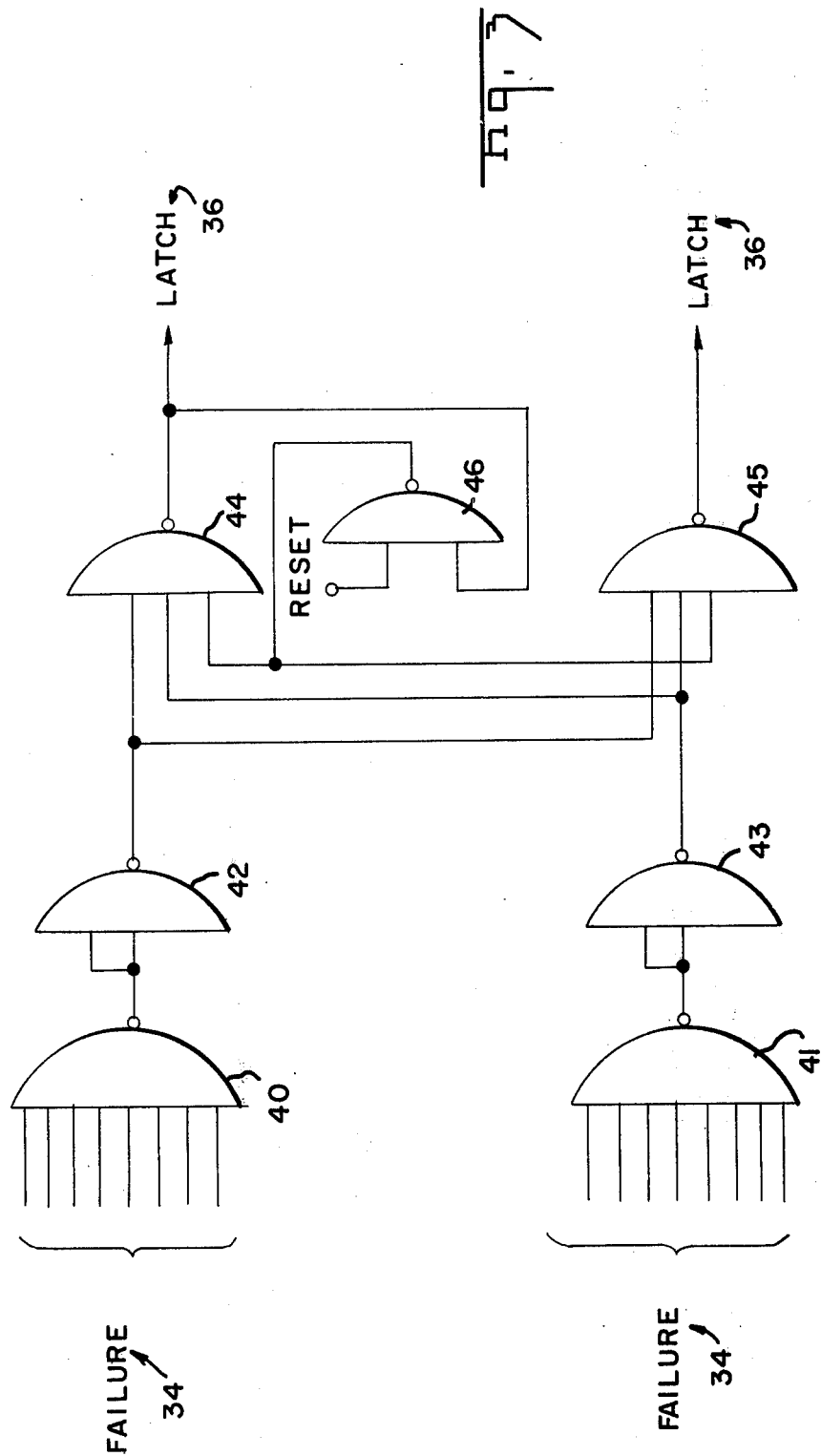

DIGITAL CIRCUIT FAILURE DETECTOR

BACKGROUND OF THE INVENTION

This invention relates to the automatic testing of digital electronic circuits in order to detect the existence of faults and their location on circuit boards by comparison of a supposed faulty device with a known fault-free device.

DESCRIPTION OF THE PRIOR ART

Comparison testing of circuit boards in order to determine whether a particular board is faulty is well known. However, determining the exact location of the fault on the board poses a much more difficult problem than simply isolating defective boards. In the past when trouble-shooting circuit boards containing digital loops, it has often been impossible to determine the location of the failure net since any failures which occur are propagated throughout the loop thus causing failures at all interconnected points. With the great increase in the complexity of electronic circuits the inability to locate the exact source of trouble has greatly increased the time required for a technician to locate the error and to replace the faulty device, resulting in costly down time.

The prior art has recognized, as evidenced by U.S. Pat. No. 2,925,591 to Burkhart, that since there is a time delay while errors are propagated throughout the loop, it is possible to locate the source of an error by detecting which point in the circuit under test is the first to fail. Thus, by comparing various checkpoints in the test circuit with the corresponding points in a comparison circuit and noting the time elapsed as each failure occurs, the faulty device may be isolated. However, the known prior art device for carrying out this procedure suffers from serious drawbacks. This device operates sequentially, i.e., it checks a first point on the faulty circuit board, comparing it with the same point in a known good circuit and if a failure is detected, it is assumed to be the first failure. However, in the event that this assumption might be incorrect, remaining checkpoints are tested sequentially. If another failure is detected, it is compared against the assumed first failure by means of a timing circuit to determine which failure occurred first. This process is repeated over and over until each and every checkpoint is tested, one at a time, and the first failure point is isolated.

It should be apparent that in a high density electronic circuit containing a number of 16 pin integrated circuits, the number of checkpoints may be so large that a procedure such as that used in the prior art will be tedious and time consuming. Further, the device disclosed by Burkhart makes extensive use of electromechanical switching devices which operate at relatively slow speeds and which are somewhat unreliable when compared with solid state switching.

Accordingly, it is an object of the present invention to provide a device for trouble-shooting digital circuits which contain digital loops having the capability of quickly and accurately locating the failing net by isolating the first checkpoint in the circuit to fail.

It is a further object of this invention to provide a first failure detecting comparator-type device which also indicates the location of other failures regardless of whether they are the first to fail.

It is still a further object of the present invention to provide a first failure detecting trouble-shooting device utilizing the advantages of speed and reliability provided by solid state circuitry.

SUMMARY OF THE INVENTION

The present invention accomplishes these and other objects by simultaneously comparing checkpoints comprising the corresponding pins of two 14 or 16 pin integrated circuits, one located on the faulty board and one on the standard board. At each point at which a noncomparison is detected a failure signal is generated which causes a visible signal to be displayed thus indicating the particular pins of the integrated circuit which are failing regardless of whether or not they are the first to fail. In addition, each failure signal also attempts to set a first fail latch. The timing of the signals is such that only the failure signal which represents the first pin to fail, will be able to set the first fail latch and to activate a blinking visible display thus giving an indication of the particular pin which is the first to fail. The latch will then prevent any subsequent failure signals from generating a first fail output by activating inhibit circuitry.

DESCRIPTION OF THE DRAWINGS

The foregoing and other objects, features and advantages of the present invention will be better understood from the following more detailed description and appended claims together with the accompanying drawings in which:

FIG. 3 is a circuit diagram of the INHIBIT circuit which generates a latch signal for preventing failure signals subsequent to the first failure signal from exhibiting a first fail output.

DESCRIPTION OF A PREFERRED EMBODIMENT

Figure 1:
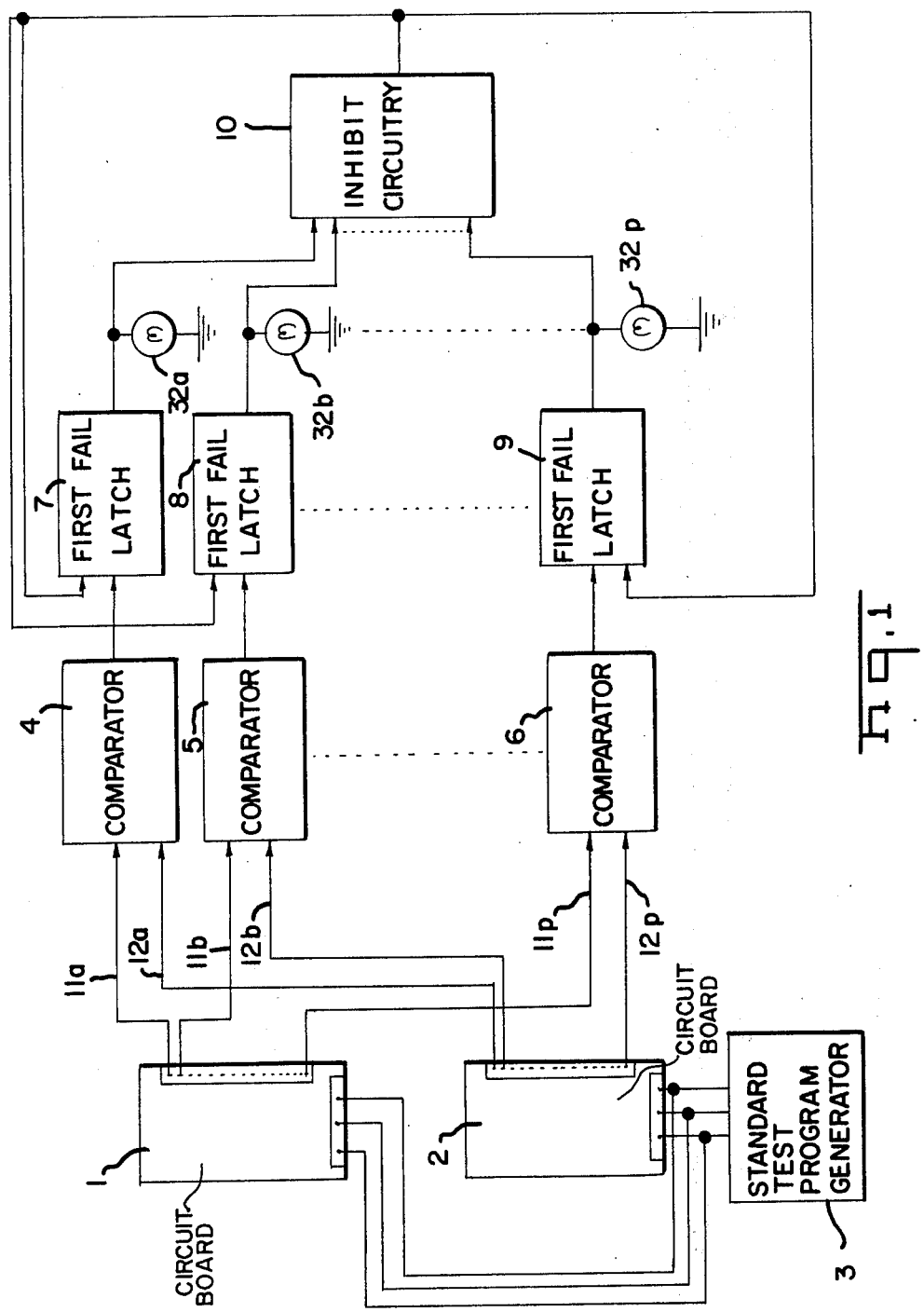
FIG. 1 is a block diagram showing the first fail comparator.

Referring to FIG. 1, there is depicted a circuit board 1 which is under test. Circuit boards commonly have a plurality of electronic circuits at least some of which are serially connected so that an error signal caused by a failure of a particular circuit is propagated through successive circuits. Also shown is a circuit board 2 which is known to be reliable. A generator 3 generates a standard test program which is simultaneously applied to the various input terminals of circuit boards 1 and 2 in a manner which continuously generates failure patterns in the circuits of the boards. Generator 3 may generate a pattern such as the Industry Standard Gray Code which is a binary pattern in which no two lines switch at the same time. Generators of such codes are commercially available, one example being that available from the Data Test Corp. A first set of lines including lines 11a and 11b . . . 11p are connectable to the outputs of a plurality of circuits on the first circuit board 1. Commonly, there are 16 such lines connectable through a pin connector to the circuit board. A second set of lines including lines 12a and 12b . . . 12p are similarly connected to the outputs of corresponding circuits on the second circuit board 2 which contains the same circuits as board 1.

A plurality of comparators including comparators 4, 5 and 6 are provided, one comparator for each line in the first set. Corresponding lines in the first and second sets of lines are connected to each comparator. That is, the lines 11a and 12a are applied to comparator 4, lines 11b and 12b are applied to comparator 5 and so on. Each comparator produces an error output representing difference between the outputs on corresponding lines of the first and second sets of lines.

A plurality of first failure latches including latches 7, 8 and 9 are provided, one latch for each comparator. The error output of each comparator is applied to set the corresponding latch. The outputs of the first failure latches are applied to inhibit circuitry 10 and to a plurality of indicating devices 32a and 32b . . . 32p. This circuitry responds to the first occurring error output but is thereafter inhibited from further setting of first failure latches.

The operation of the first fail comparator will be better understood from the following description of specific comparator and inhibit circuits.

Figure 2:
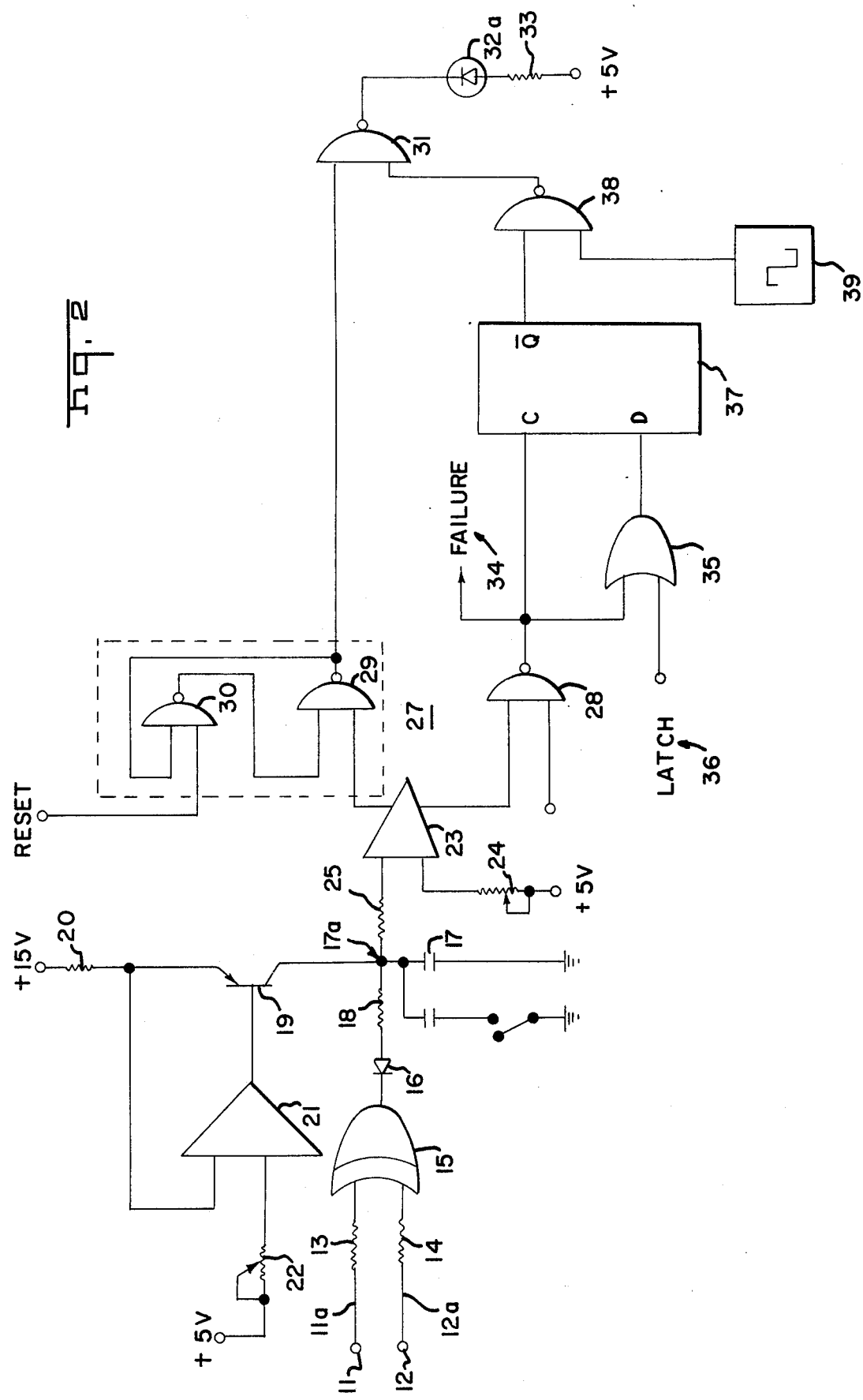
FIG. 2 is a circuit diagram of one of sixteen comparator circuits, each of which is connected to corresponding pins on the test and standard circuits.

Referring now to FIG. 2, a comparator circuit will be seen. There are sixteen circuits of this type, generally one for each pin of the device being compared but only one such circuit is shown for the sake of clarity. Pin 11 is connected to a checkpoint in a circuit on the first board 1. Typically, this point will be one pin of a driving integrated circuit. Pin 12 is connected to a corresponding pin of a device on the other board 2. Inputs are simultaneously applied to the corresponding circuits being compared and the outputs which are generated at each pin of the integrated circuit are applied through the lines 11a and 12a, containing resistors 13 and 14 respectively, to the exclusive OR gates 15. The output of exclusive OR gate 15 is normally low but if the inputs from the two circuits being compared are different, the output goes high.

The output of exclusive OR gate 15 is connected by a diode 16 to an integrator which includes the capacitor 17 and the resistor 18. Integration current is supplied to junction 17a between resistor 18 and capacitor 17 by a constant current source which includes the transistor 19 whose emitter is connected to a source of positive voltage through the resistor 20. The amount of this current is controlled by the operational amplifier 21 which is, in turn, controlled by the current flowing from a second source of positive voltage through potentiometer 22. When the output of OR gate 15 goes high indicating a failure, the capacitor 17 begins to charge. As the capacitor charges an increasing amount of current from the constant current source is applied to one input of an operational comparator amplifier 23 connected by resistor 25 to junction 17a. A threshold level current flowing from a positive voltage source is applied to the other input of operational amplifier 23 through potentiometer 24. When the current through resistor 25 exceeds the threshold current, the comparator amplifier 23 generates an output. Since an output of comparator amplifier 23 may represent merely an admissable or nonsignificant difference in the components being compared, the potentiometer 22 is adjustable to control the integration current and thus the amount of failure time. Potentiometer 24 is adjustable to control the threshold current and thus the magnitude of the failure required before an error signal is exhibited. Further, if even longer failure times are required than those obtainable using capacitor 17, capacitor 26 may be placed in parallel with capacitor 17 by closing switch 26a.

The output of the comparator amplifier 23 is applied to both a primary failure latch 27 and also the NAND gate 28. The primary failure latch is comprised of the NAND gates 29 and 30 which are connected in flip-flop arrangement. The output of primary failure latch 27 is normally a binary 1 and this output is applied to the NAND gate 31. The output of NAND gate 31 is normally a binary 1 and this output is connected to an indicating device which is typically the cathode of a normally quiescent light emitting diode 32. The anode of light emitting diode 32a is connected to a source of positive voltage (typically 5v) through resistor 33. When the comparator amplifier 23 generates an output indicating a fault at a particular pin, the primary failure latch 27 is set, the output of NAND gate 31 becomes a binary 0 and the light emitting diode 32 is illuminated to indicate that a failure has been detected. Since there are 16 light emitting diodes, one for each of the 16 pins under test, the location of the failure will also be displayed.

However, in order to determine whether the failure is the first to occur, the output of comparator amplifier 23 which is normally a binary 0 is also applied to the NAND gate 28. Since the other input of NAND gate 28 is a binary 1, its output is usually also a binary 1 but when the comparator amplifier 23 generates an output, NAND gate 28 generates at its output a failure signal 34 which is equal to a binary 0. This failure signal 34 is applied to the INHIBIT circuit shown in FIG. 3 which will be more fully described below, and also to the OR gate 35. If the component failure indicated by an output of comparator amplifier 23 signifies the first component on the board to fail, then the output of comparator amplifier 23 will also pass through OR gate 35. If the component is not the first to fail, a latch signal 36 equal to a binary 1 is emitted by the INHIBIT circuit of FIG. 3 and this signal will be applied to inhibit OR gate 35. The output of OR gate 35 is applied to the first failure latch 37 which is typically a flip-flop (a Texas Instruments 74–279 type device) whose Q output is, in turn, connected to the NAND gate 38 along with the output of an oscillator circuit 39. Oscillator circuit 39 is of any conventional design and produces an oscillating output of typically 5 Hz.

The output of NAND gate 38, which is normally a binary 1, is applied to the NAND gate 31. If the first fail flip-flop 37 is set to indicate a first failure, NAND gate 38 will exhibit an oscillating output which when applied to the NAND gate 31 will cause light emitting diode 32a to blink, thus indicating the particular pin which is the first to fail.

In order that one and only one pin of the circuit under test exhibit the first fail blinking display, some means of inhibiting subsequent failures from setting their corresponding first fail flip-flops must be provided and thus the inhibit circuitry of FIG. 3 is operative to generate a signal 36 equal to a binary 1. This signal is applied to the OR gates 35 of the remaining 15 pins which are not the first to fail. Referring to the circuit shown in FIG. 3, it will be seen that each of the failure signals 34 emanating from the 16 circuits of the type shown in FIG. 2, are applied to the inputs of the NAND gates 40 and 41. The inputs to these gates are normally at a binary 1 while the outputs are held at a binary 0. The outputs of NAND gates 40 and 41 are applied to and are inverted by NAND gates 42 and 43 whose inputs are shorted. The outputs of gates 42 and 43 are applied to the NAND gates 44 and 45 whose corresponding inputs are coupled in common. Gates 44 and 45 are each capable of generating 8 latch signals. When the first failure signal is applied to one of the inputs of gates 40 and 41 indicating a failure at a particular pin, gates 44 and 45 issue latch signals equal to a binary 1 to the remaining 15 pins. These latch signals 36 are applied to the respective OR gates 35 and are effective to prevent the setting of respective first fail flip-flops 37.

At the end of each comparison, a reset signal equal to binary 0 is applied to the inputs of NAND gate 30 of primary failure latch 27 and to a NAND gate 46 of the INHIBIT circuit. The output of NAND gate 46 is connected to the inputs of NAND gates 44 and 45. It should be apparent that a reset signal applied to the terminals of NAND gates 30 and 46 renders both the primary fail latch 27 and the first fail flip-flop 37 operative for future comparisons.

While a particular embodiment of the invention has been shown and described, it will, of course, be understood that various modifications may be made without departing from the principles of the invention. The appended claims, are, therefore, intended to cover any such modifications within the true spirit and scope of the invention.

What is claimed is:

1. A failure detector for circuit boards each having electronic circuits thereon at least some of which are serially connected so that an error signal caused by a failure of a circuit is propagated through successive circuits comprising:
   a first set of lines connectable to the outputs of a plurality of circuits on a first circuit board,
   a second set of lines connectable to the outputs of corresponding circuits on a second circuit board which is the same as said first circuit board,
   a plurality of comparators, one for each line in said first set, corresponding lines in said first and second sets of lines being simultaneously applied to each comparator, each comparator producing an error output representing the difference between the outputs on corresponding lines of said first and second sets,
   a plurality of first failure latches, one for each comparator, the error output of each comparator being applied to set the corresponding latch, and
   inhibit circuitry responsive to the first occurring error output for inhibiting the further setting of first failure latches.

2. A failure detector recited in claim 1 further comprising:
   a plurality of primary failure latches, one for each comparator, the error output of each comparator being applied to set the corresponding primary failure latch.

3. The failure detector recited in claim 2 further comprising:
   a plurality of indicators, one for each first failure latch, a first failure latch and a corresponding primary failure latch being connected to each indicator so that said indicator produces one display when the primary failure latch is set and the first failure latch is not set, and wherein said indicator produces a different display when both the first failure and primary failure latches are set.

4. The failure detector recited in claim 1 further comprising a plurality of integrators, the error output from each comparator being applied to an integrator, the output of said integrator representing said differences between the outputs on corresponding lines without nonsignificant differences.

5. The failure detector recited in claim 1 wherein said comparators each comprise an exclusive OR gate and an operational amplifier.

6. The failure detector recited in claim 1 further comprising:
   a plurality of indicating devices, one indicating device for each first failure latch, each latch being connected to energize the corresponding indicator when the latch is set.

* * * * *